United States Patent
Kwok et al.

(10) Patent No.: US 12,408,362 B2
(45) Date of Patent: Sep. 2, 2025

(54) METHOD OF FORMING DEVICES WITH STRAINED SOURCE/DRAIN STRUCTURES

(71) Applicant: TAIWAN SEMICONDUCTOR MANUFACTURING COMPANY, LTD., Hsinchu (TW)

(72) Inventors: Tsz-Mei Kwok, Hsinchu (TW); Hsueh-Chang Sung, Hsinchu (TW); Kuan-Yu Chen, Hsinchu (TW); Hsien-Hsin Lin, Hsinchu (TW)

(73) Assignee: AIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 560 days.

(21) Appl. No.: 17/864,033

(22) Filed: Jul. 13, 2022

(65) Prior Publication Data

US 2022/0352346 A1 Nov. 3, 2022

Related U.S. Application Data

(60) Division of application No. 15/910,701, filed on Mar. 2, 2018, now Pat. No. 11,411,098, which is a
(Continued)

(51) Int. Cl.
*H10D 30/01* (2025.01)
*H10D 30/60* (2025.01)
*H10D 30/69* (2025.01)
*H10D 62/00* (2025.01)
*H10D 62/822* (2025.01)

(52) U.S. Cl.
CPC ..... *H10D 30/0227* (2025.01); *H10D 30/0212* (2025.01); *H10D 30/0275* (2025.01); *H10D 30/608* (2025.01); *H10D 30/797* (2025.01); *H10D 62/021* (2025.01); *H10D 62/822* (2025.01)

(58) Field of Classification Search
CPC ........... H10D 30/0227; H10D 30/0212; H10D 30/0275; H10D 30/608; H10D 30/797; H10D 62/021; H10D 62/822
See application file for complete search history.

(56) References Cited

U.S. PATENT DOCUMENTS 6,323,090 B1  11/2001  Zommer
6,891,192 B2   5/2005  Chen et al.
(Continued)

*Primary Examiner* — Britt D Hanley
*Assistant Examiner* — William C. Trice, III
(74) *Attorney, Agent, or Firm* — Hauptman Ham, LLP

(57) ABSTRACT

A method includes etching a trench in a substrate adjacent to a gate structure, wherein the trench includes a bottom surface and a tip portion extending under a spacer of the gate structure. The method further includes epitaxially growing a first semiconductor material in the trench, wherein the first semiconductor material covers an entirety of the bottom surface of the trench, and the first semiconductor material grows in the tip portion. The method further includes epitaxially growing a second semiconductor material in the trench, wherein the second semiconductor material is different from the first semiconductor material, the second semiconductor material covers the first semiconductor material, and the second semiconductor material directly contacts the substrate between the bottom surface of the trench and the tip portion.

20 Claims, 10 Drawing Sheets

Related U.S. Application Data continuation of application No. 14/255,011, filed on Apr. 17, 2014, now Pat. No. 9,911,826, which is a continuation of application No. 13/009,322, filed on Jan. 19, 2011, now Pat. No. 8,796,788.

(56) References Cited

U.S. PATENT DOCUMENTS

| | | |
|---|---|---|
| 7,195,983 B2 | 3/2007 | Chindalore et al. |
| 7,759,199 B2 | 7/2010 | Thomas et al. |
| 7,776,699 B2 | 8/2010 | Liu et al. |
| 8,120,120 B2 | 2/2012 | Yang et al. |
| 8,344,447 B2 | 1/2013 | Lin et al. |
| 8,367,528 B2 | 2/2013 | Bauer et al. |
| 2006/0038230 A1 | 2/2006 | Ueno et al. |
| 2007/0012913 A1 | 1/2007 | Ohta et al. |
| 2007/0202669 A1 | 8/2007 | Fukuda et al. |
| 2007/0210301 A1 | 9/2007 | Han |
| 2008/0185612 A1 | 8/2008 | Fukuda et al. |
| 2008/0203427 A1 | 8/2008 | Mowry et al. |
| 2008/0246057 A1 | 10/2008 | Lin et al. |
| 2009/0039399 A1 | 2/2009 | Sudo |
| 2009/0075029 A1 | 3/2009 | Thomas et al. |
| 2009/0095992 A1 | 4/2009 | Sanuki et al. |
| 2009/0134381 A1 | 5/2009 | Shimamune et al. |
| 2009/0194788 A1 | 8/2009 | Liu et al. |
| 2010/0109044 A1 | 5/2010 | Tekleab et al. |
| 2010/0171181 A1 | 7/2010 | Rhee et al. |
| 2011/0062498 A1 | 3/2011 | Yang et al. |
| 2011/0104875 A1* | 5/2011 | Wojtczak ............. H10D 62/021 257/E21.09 |
| 2012/0025315 A1* | 2/2012 | Kronholz ........... H10D 30/0227 257/E29.264 |
| 2015/0236157 A1 | 8/2015 | Kwok et al. |

* cited by examiner

METHOD OF FORMING DEVICES WITH STRAINED SOURCE/DRAIN STRUCTURES

PRIORITY CLAIM

The present application is a divisional of U.S. application Ser. No. 15/910,701, filed Mar. 2, 2018, now U.S. Pat. No. 11,411,098, issued Aug. 9, 2022, which is a continuation of U.S. application Ser. No. 14/255,011, filed Apr. 17, 2014, now U.S. Pat. No. 9,911,826, issued Mar. 6, 2018, which is a continuation of U.S. application Ser. No. 13/009,322, filed Jan. 19, 2011, now U.S. Pat. No. 8,796,788, issued Aug. 5, 2014, which are incorporated herein by reference in their entireties.

TECHNICAL FIELD

The present disclosure relates to integrated circuit devices and methods for manufacturing integrated circuit devices.

BACKGROUND

The semiconductor integrated circuit (IC) industry has experienced rapid growth. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advances to be realized, similar developments in IC manufacturing are provided. For example, as semiconductor devices, such as metal-oxide-semiconductor field-effect transistors (MOSFETs), are scaled down through various technology nodes, strained source/drain features (e.g., stressor regions) have been implemented using epitaxial (epi) semiconductor materials to enhance carrier mobility and improve device performance. Forming a MOSFET with stressor regions often implements epitaxially grown silicon (Si) to form raised source and drain features for an n-type device, and epitaxially growing silicon germanium (SiGe) to form raised source and drain features for a p-type device.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
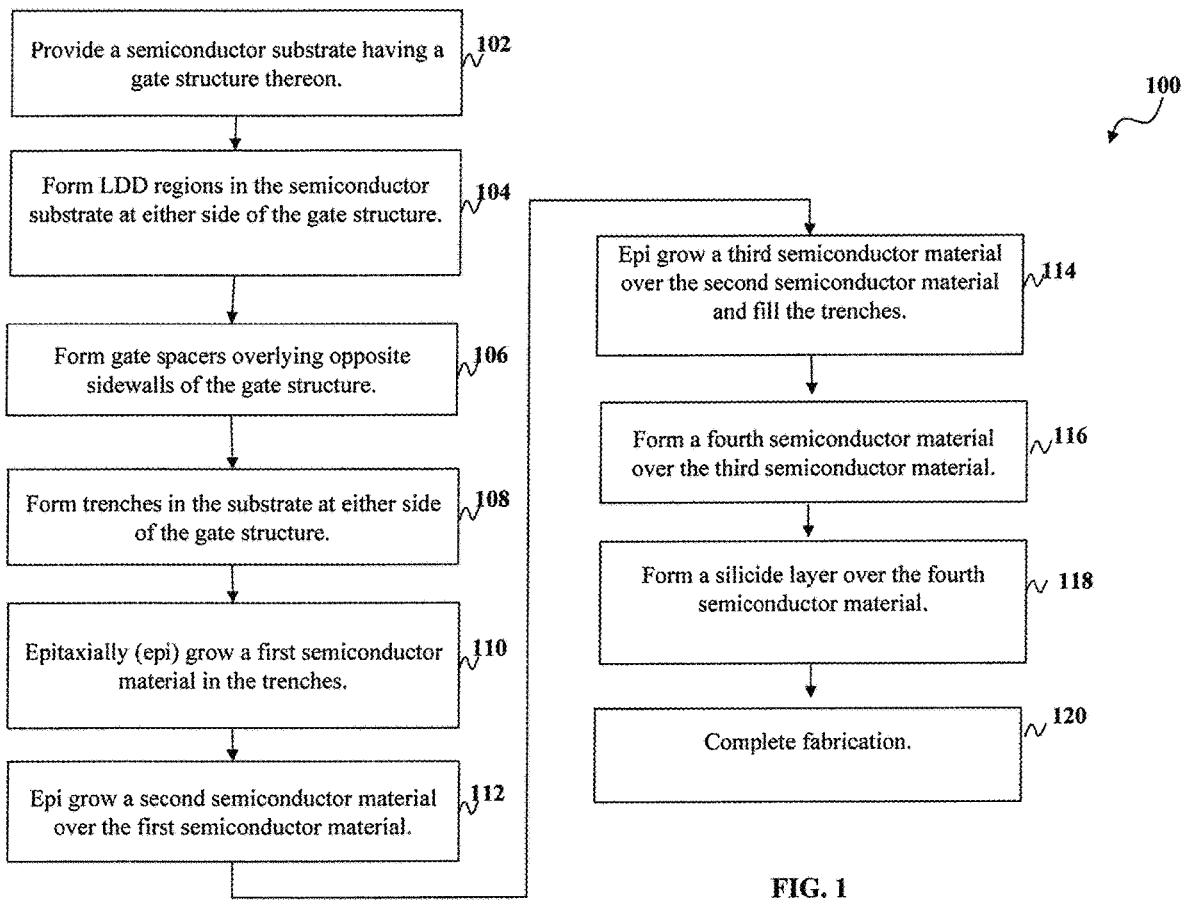
FIG. 1 is a flow chart of a method for fabricating an integrated circuit device according to an embodiment of the present disclosure.

It is understood that the following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

With reference to FIGS. 1 and 2-9, a method 100 and a semiconductor device 200 are collectively described below. The semiconductor device 200 illustrates an integrated circuit, or portion thereof, that can comprise memory cells and/or logic circuits. The semiconductor device 200 can include passive components such as resistors, capacitors, inductors, and/or fuses; and active components, such as P-channel field effect transistors (PFETs), N-channel field effect transistors (NFETs), metal-oxide-semiconductor field effect transistors (MOSFETs), complementary metal-oxide-semiconductor transistors (CMOSs), high voltage transistors, and/or high frequency transistors, other suitable components, and/or combinations thereof. It is understood that additional steps can be provided before, during, and/or after the method 100, and some of the steps described below can be replaced or eliminated, for additional embodiments of the method. It is further understood that additional features can be added in the semiconductor device 200, and some of the features described below can be replaced or eliminated, for additional embodiments of the semiconductor device 200.

Figure 2:
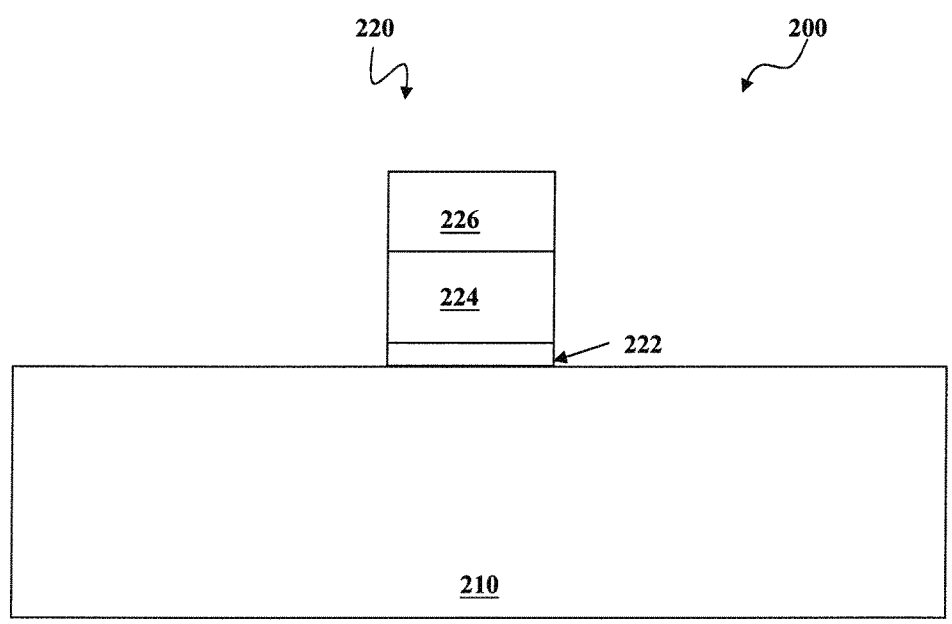
FIGS. 2-9 are various diagrammatic cross-sectional views of an embodiment of an integrated circuit device during various fabrication stages according to the method of FIG. 1.

Referring to FIGS. 1 and 2, the method 100 begins at step 102, wherein a substrate 210 is provided. In the present embodiment, the substrate 210 is a semiconductor substrate comprising silicon. Alternatively, the substrate 210 comprises an elementary semiconductor including silicon and/or germanium in crystal; a compound semiconductor including silicon carbide, gallium arsenide, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. The alloy semiconductor substrate may have a gradient SiGe feature in which the Si and Ge composition change from one ratio at one location to another ratio at another location of the gradient SiGe feature. The alloy SiGe may be formed over a silicon substrate. The SiGe substrate may be strained. Furthermore, the semiconductor substrate may be a semiconductor on insulator (SOI). In some examples, the semiconductor substrate may include a doped epi layer. In other examples, the silicon substrate may include a multilayer compound semiconductor structure.

The substrate 210 may include various doped regions depending on design requirements (e.g., p-type wells or n-type wells). The doped regions may be doped with p-type dopants, such as boron or $BF_2$; n-type dopants, such as phosphorus or arsenic; or a combination thereof. The doped regions may be formed directly in the substrate 210, in a P-well structure, in an N-well structure, in a dual-well structure, or using a raised structure. The semiconductor device 200 may include a PFET device and/or a NFET device, and thus, the substrate 210 may include various doped regions configured for the PFET device and/or the NFET device. A gate structure 220 for the PFET device and/or the NFET device is formed over the substrate 210. In some embodiments, the gate structure 220 includes, in order, a gate dielectric 222, a gate electrode 224, and a hard mask 226. The gate structure 220 may be formed by deposition, lithography patterning, and etching processes.

The gate dielectric 222 is formed over the substrate 210 and includes a dielectric material, such as silicon oxide, silicon oxynitride, silicon nitride, a high-k dielectric material, other suitable dielectric material, or combinations thereof. Exemplary high-k dielectric materials include $HfO_2$, HfSiO, HfSiON, HfTaO, HfTiO, HfZrO, other suitable materials, or combinations thereof. The gate dielectric 222 may be a multilayer structure, for example, including an interfacial layer, and a high-k dielectric material layer formed on the interfacial layer. An exemplary interfacial layer may be a grown silicon oxide layer formed by a thermal process or atomic layer deposition (ALD) process.

The gate electrode 224 is formed over the gate dielectric 222. In some embodiments, the gate electrode 224 is formed by a polycrystalline silicon (polysilicon) layer. The polysilicon layer may be doped for proper conductivity. Alternatively, the polysilicon is not necessarily doped if a dummy gate is to be formed and replaced in a subsequent gate replacement process. Alternatively, the gate electrode 224 could include a conductive layer having a proper work function. Therefore, the gate electrode 224 can also be referred to as a work function layer. The work function layer may comprise any suitable material, such that the layer can be tuned to have a proper work function for enhanced performance of the associated device. For example, if a p-type work function metal (p-metal) for the PFET device is desired, TiN or TaN may be used. On the other hand, if an n-type work function metal (n-metal) for the NFET device is desired, Ta, TiAl, TiAlN, or TaCN, may be used. The work function layer may include doped conducting oxide materials. The gate electrode 224 may include other conductive materials, such as aluminum, copper, tungsten, metal alloys, metal silicide, other suitable materials, or combinations thereof. For example, where the gate electrode 224 includes a work function layer, another conductive layer can be formed over the work function layer.

The hard mask 226 formed over the gate electrode 224 includes silicon oxide, silicon nitride, silicon oxynitride, silicon carbide, other suitable dielectric material, or combinations thereof. The hard mask 226 may have a multi-layer structure.

Figure 3:
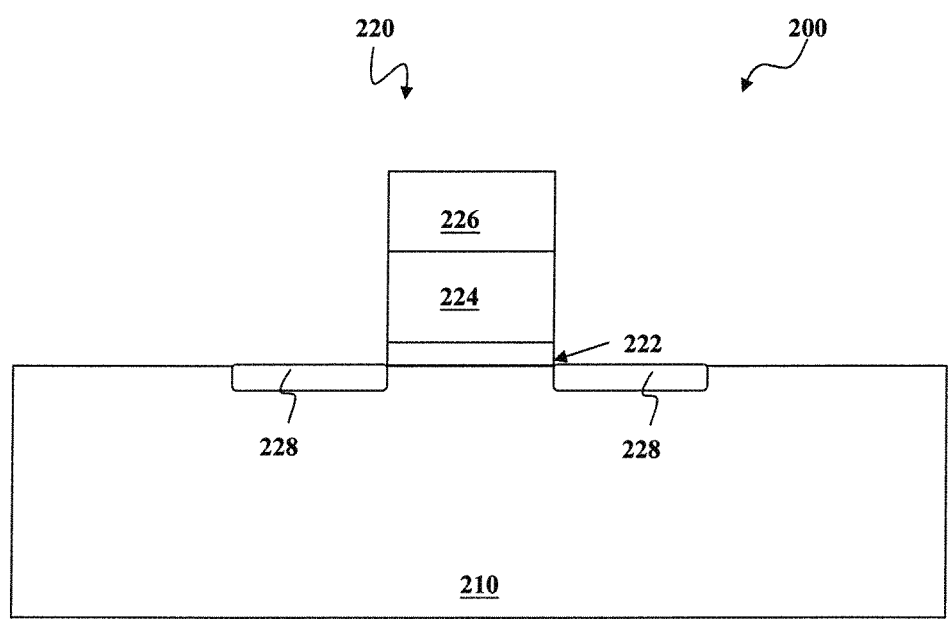

Referring to FIGS. 1 and 3, the method 100 continues with step 104 in which lightly doped source/drain (LDD) regions 228 are formed in the substrate 210, interposed by the gate structure 220. In some embodiments, the LDD regions 228 are substantially aligned with the sidewalls of the gate structure 220. The LDD regions 228 may be formed by ion implantation, plasma-based ion implantation, gaseous or solid source thermal diffusion, deposition, or combinations thereof. In one embodiment, the LDD regions 228 are doped with p-type dopant, such as boron and/or $BF_2$, for the PFET device (PLDD). In another embodiment, the LDD regions 228 are doped with n-type dopant, such as phosphorous and/or arsenic, for the NFET device (NLDD).

Figure 4:
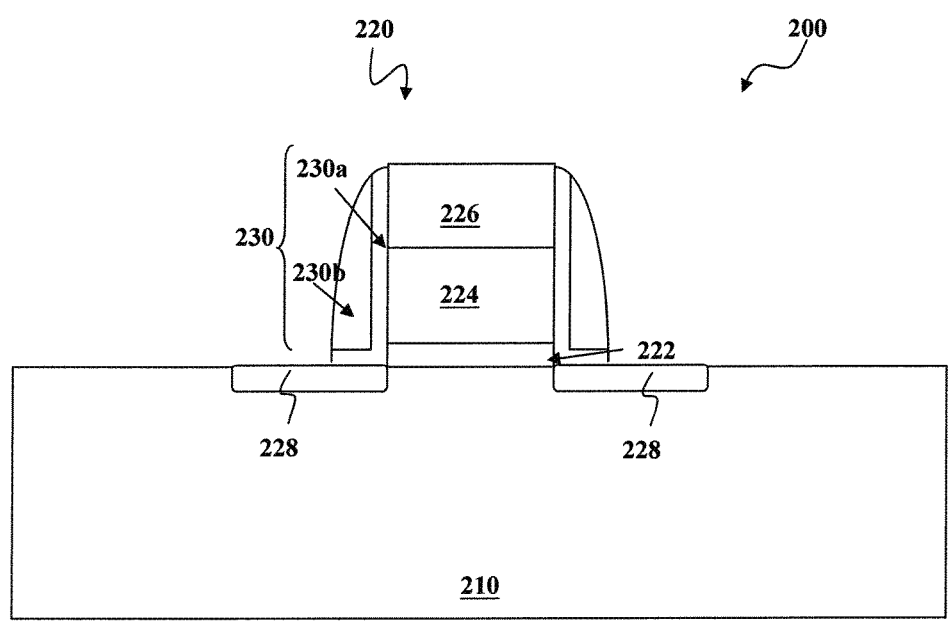

Referring to FIGS. 1 and 4, the method 100 continues with step 106 in which gate spacers 230 are formed overlying opposite sidewalls of the gate structure 220. In the depicted embodiment, a first spacer material (not shown) is deposited over the gate structure 220 and the substrate 210. The first spacer material may be formed by plasma-enhanced chemical vapor deposition (PECVD) and/or other suitable processes. In an embodiment, the first spacer material is a dielectric layer comprising silicon oxide. In an embodiment, the first spacer material has a thickness of less than approximately 150 Angstroms. Thereafter, a second spacer material (not shown) is deposited over the first spacer material. The second spacer material may be deposited using physical vapor deposition (PVD) (i.e., sputtering), chemical vapor deposition (CVD), plasma-enhanced chemical vapor deposition (PECVD), atmospheric pressure chemical vapor deposition (APCVD), low-pressure CVD (LPCVD), high density plasma CVD (HDPCVD), atomic layer CVD (ALCVD), and/or other suitable processes. In an embodiment, the second spacer material is a dielectric layer comprising silicon nitride. Other exemplary compositions include silicon oxide, silicon carbide, silicon oxynitride, combinations thereof, and/or other suitable materials. In an embodiment, the second spacer material has a thickness less than approximately 200 Angstroms.

Continuing with step 106, the first and second spacer materials are etched. The etching process may include an anisotropic etch to form the gate spacers 230 including first spacers (or may be referred to liners) 230a and second spacers 230b. The first and second spacer materials are partially removed from the substrate 210 in regions where epitaxial regions or raised source/drain regions will be formed. The second and first spacer materials are partially removed such that the second spacers 230b with a D-shaped structure and the first spacers 230a with an L-shaped structure are formed.

Figure 5:
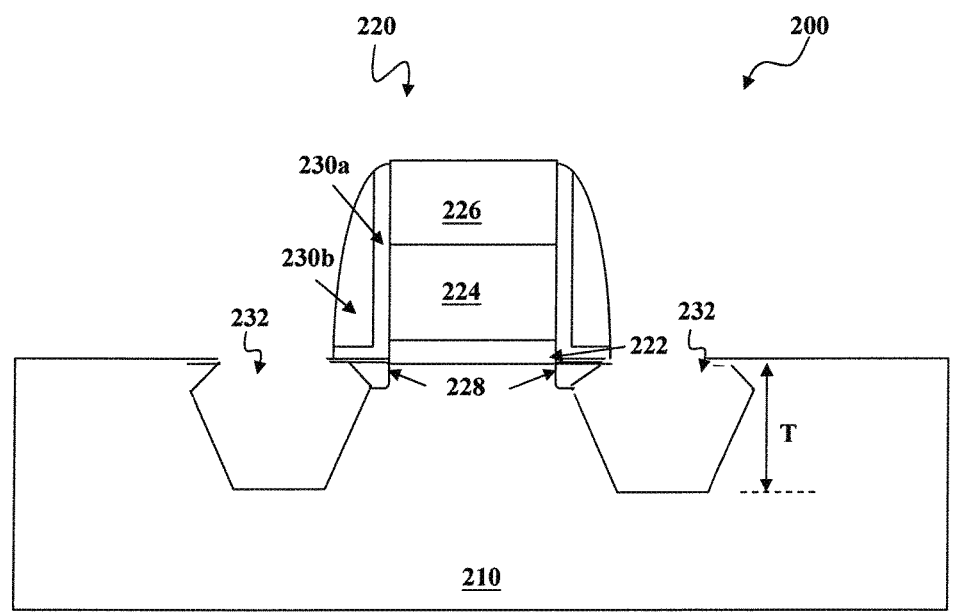

In FIGS. 5, 5A, and 6-8, source/drain engineering is performed to configure source/drain regions for the PFET device or the NFET device. Referring to FIGS. 1 and 5, the method 100 continues with step 108 in which trenches 232 are formed in the substrate 210 at either side of the gate structure 220, particularly in the source and drain region of the PFET device or the NFET device. In the depicted embodiment, the trenches 232 have a depth T ranging between about 300 Angstroms and about 700 Angstroms.

A capping layer (not shown) and a photoresist layer (not shown) may be formed over the semiconductor device 210 and then patterned to protect the other device region. The photoresist layer may further include an antireflective coating layer (not shown), such as a bottom antireflective coating (BARC) layer and/or a top antireflective coating (TARC) layer. An etching process then removes portions of the substrate 210 to form the trenches 232 in the substrate 210. The etching process includes a dry etching process, wet etching process, or combination thereof. In some embodiments, the etching process utilizes a combination of dry and wet etching processes. The dry and wet etching processes have etching parameters that can be tuned, such as which etchants are used, etching temperature, etching solution concentration, etching pressure, source power, RF bias voltage, RF bias power, etchant flow rate, and other suitable parameters.

For example, the dry etching process may utilize an etching pressure of about 1 mTorr to about 200 mTorr, a source power of about 200 W to about 2000 W, an RF bias voltage of about 0 V to about 100 V, and an etchant that includes $NF_3$, $Cl_2$, $SF_6$, He, Ar, $CF_4$, or combinations thereof. In an example, the dry etching process includes an etching pressure of about 1 mTorr to about 200 mTorr, a source power of about 200 W to about 2000 W, an RF bias voltage of about 0 V to about 100 V, a $NF_3$ gas flow of about 5 sccm to about 30 sccm, a $Cl_2$ gas flow of about 0 sccm to about 100 sccm, a He gas flow of about 0 sccm to about 500 sccm, and an Ar gas flow of about 0 sccm to about 500 sccm. In another example, the etching process includes an etching pressure of about 1 mTorr to about 200 mTorr, a source power of about 200 W to about 2000 W, an RF bias voltage of about 0 V to about 100 V, a $SF_6$ gas flow of about 5 sccm to about 30 sccm, a $Cl_2$ gas flow of about 0 sccm to about 100 sccm, a He gas flow of about 0 sccm to about 500 sccm, and an Ar gas flow of about 0 sccm to about 500 sccm. In yet another example, the etching process includes an etching pressure of about 1 mTorr to about 200 mTorr, a source power of about 200 W to about 2000 W, an RF bias voltage of about 0 V to about 100 V, a $CF_4$ gas flow of about 5 sccm to about 100 sccm, a $Cl_2$ gas flow of about 0 sccm to about 100 sccm, a He gas flow of about 0 sccm to about 500 sccm, and an Ar gas flow of about 0 sccm to about 500 sccm. The wet etching solutions may include $NH_4OH$, HF (hydrofluoric acid), TMAH (tetramethylammonium hydroxide), other suitable wet etching solutions, or combinations thereof. In an example, the wet etching process first implements a 100:1 concentration of an HF solution at room temperature, and then implements a $NH_4OH$ solution at a temperature of about 20° C. to about 60° C. In another example, the wet etching process first implements a 100:1 concentration of an HF solution at room temperature, and then implements a TMAH solution at a temperature of about 20° C. to about 60° C. After the etching process, a pre-cleaning process may be performed to clean the trenches 232 with a hydrofluoric acid (HF) solution or other suitable solution.

Figure 5A:
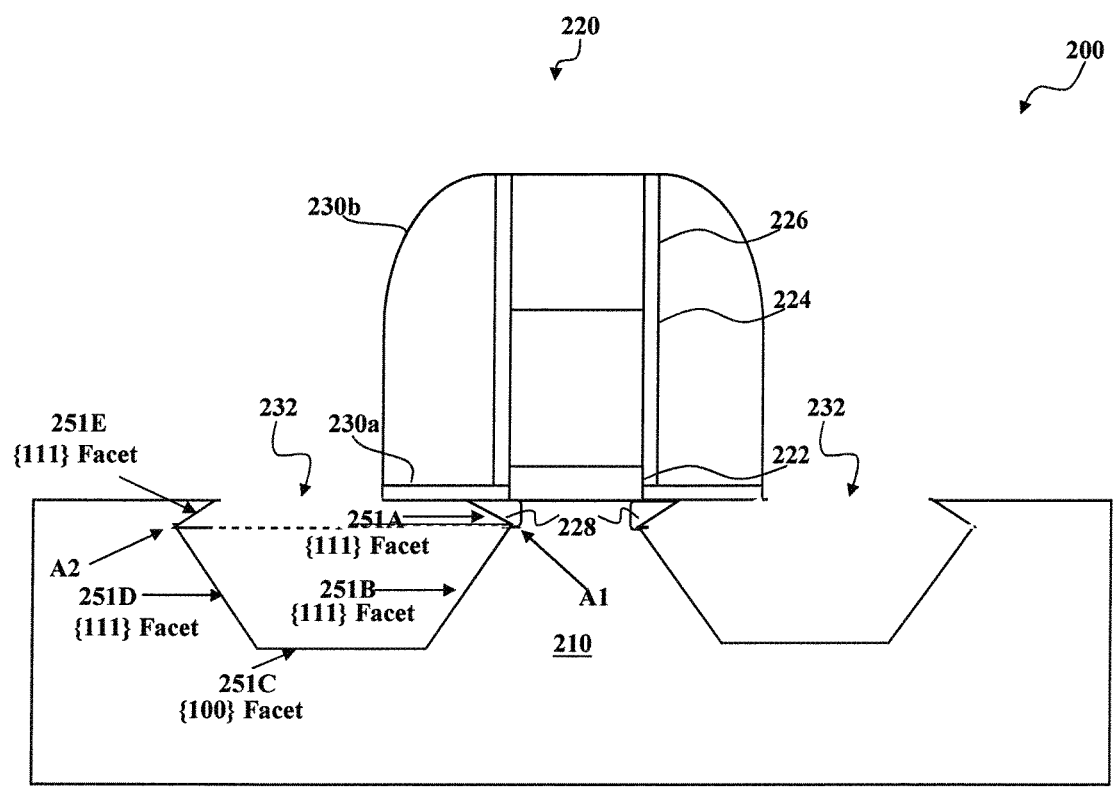

In FIG. 5A, the semiconductor device 200 is enlarged for better understanding of the etching profile of trenches 232. The etching profile of the trenches 232 defines source and drain regions of the NFET or PFET device, and the etching profile of the trenches 232 is defined by facets 251A, 251B, 251C, 251D, and 251E of the substrate 210. The facets 251A, 251B, 251D, and 251E may be referred to as shallow facets, and the facet 251C may be referred to as bottom facet. In the depicted embodiment, the etching profile of the trenches 232 is defined by facets 251A, 251B, 251D, and 251E in a {111} crystallographic plane of the substrate 210, and facet 251C in a {100} crystallographic plane of the substrate 210. The etching profile of the trenches 232 defines a tip A1 by the intersection point of the facets 251A and 251B and a tip A2 by the intersection of the facets 251D and 251E. The tip A1 may be positioned under or adjacent to a sidewall of the gate structure 220. The etching profile of the trenches 232 defines a V-shaped bottom defined by the facets 251B, 251C, and 251D.

Figure 6:
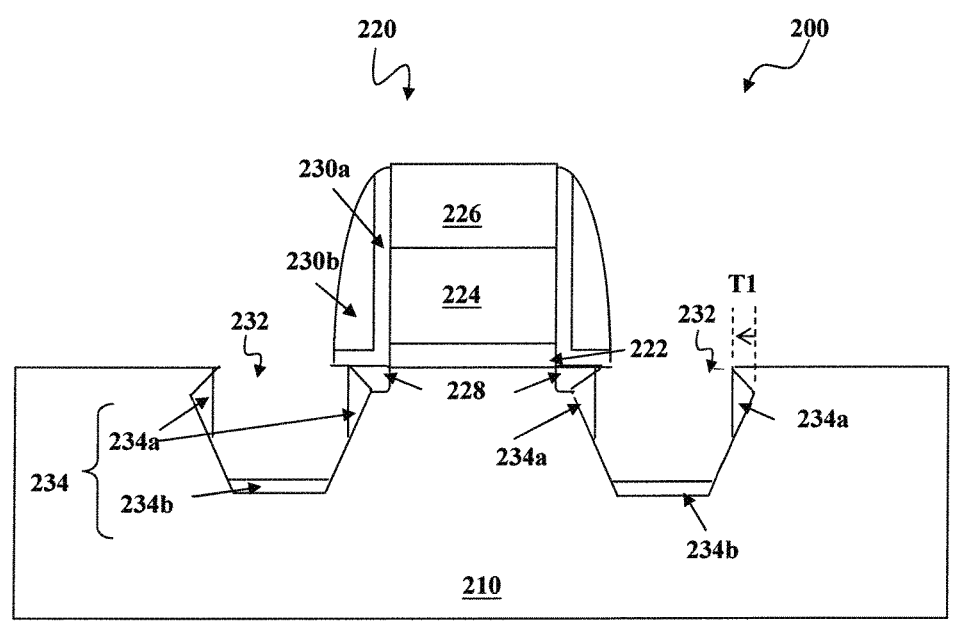

Referring to FIGS. 1 and 6, the method 100 continues with step 110 in which a first semiconductor material 234 is formed in the trenches 232. In the depicted embodiment, an epitaxy or epitaxial (epi) process is performed to form the first semiconductor material 234 in the trenches 232. The epi process may include a selective epitaxy growth (SEG) process, cyclic deposition and etching (CDE) process, chemical vapor deposition (CVD) techniques (e.g., vapor-phase epitaxy (VPE) and/or ultra-high vacuum CVD (UHV-CVD)), molecular beam epitaxy (MBE), other suitable epi processes, or combination thereof. The epi process may use gaseous and/or liquid precursors, which may interact with the composition of the substrate 210.

In some embodiments, the first semiconductor material 234 is different from the substrate 210. Accordingly, the channel region of the device is strained or stressed to enable carrier mobility of the device and enhance device performance. In one embodiment, the first semiconductor material 234 comprises silicon and at least one additional element. In another embodiment, the first semiconductor material 234 comprises silicon, and germanium or tin, which may form strained source/drain features for PFET devices. In other embodiment, the first semiconductor material 234 comprises silicon and carbon, which may form strained source/drain features for NFET devices. In some embodiments, the first semiconductor material 234 comprises the at least one additional element with a sufficient atomic ratio (at %) to provide a strain effect to the semiconductor device 200. In one embodiment, the at least one additional element is Ge and the first semiconductor material 234 is SiGe for a PFET device. In another embodiment, the atomic ratio of Ge in the first semiconductor material 234 is equal to or greater than about 35 at %. The epi process for forming the first semiconductor material 234, for example, may be performed by using a Si-containing gas (e.g., silane or dichlorosilane (DCS)); a Ge-containing gas (e.g., $GeH_4$, $GeCl_4$); a carrier gas (e.g., $H_2$); and/or a selective etching gas (e.g., HCl). Further, a mass flow ratio of the Ge-containing gas to the Si-containing gas may be equal to or higher than about 0.05. In some embodiments, the epi process may be performed under a temperature ranging between about 500° C. and about 800° C., and under a pressure ranging between about 10 Torr and about 100 Torr.

The first semiconductor material 234 may be undoped or in-situ doped with boron and/or $BF_2$ for PFET, or doped with phosphorous and/or arsenic for NFET during formation of the first semiconductor material 234. For example, the boron dopant concentration in the first semiconductor material 234 may be ranging between about 1E18 atoms/cm$^3$ and about 1E21 atoms/cm$^3$. When the first semiconductor material 234 is undoped, it is understood that it may be doped in a subsequent process. The doping may be achieved by an ion implantation process, plasma immersion ion implantation (PIII) process, gas and/or solid source diffusion process, other suitable process, or combinations thereof. The first semiconductor material 234 may further be exposed to annealing processes, such as a rapid thermal annealing (RTA) process.

The first semiconductor material 234 has a thickness T1. In one embodiment, the thickness T1 is equal to or less than about 150 Angstroms to prevent defects and strain relaxation formed by the first semiconductor material 234. In another embodiment, the thickness T1 is equal to or greater than about 50 Angstroms to provide an effective strain to the semiconductor device 200. In some embodiments, the first semiconductor material 234 is a non-continuous film and deposited only within tips A1, A2 and over facet 251C because the thickness T1 of the first semiconductor material 234 is thin and the epi growth rate in <111> direction is slower than the epi growth rate in <100> direction. The first semiconductor material 234 may comprise discrete portions including upper portions 234a within tips A1 and A2 of the trenches 232 and a bottom portion 234b over bottom surface of the trenches 232. The portions of first semiconductor material 234 at tips A1, A2 have a thickness contributed by two growth planes, facets 251A/251B and facets 251D/251E, respectively, during the epi growth process. Hence, the thickness of first semiconductor material 234 at tips A1, A2 is thicker than a thickness of the portions of first semiconductor material 234 on the {111} facets 251A, 251B, 251D, or 251E, therefore forming the upper portions 234a with triangle-shaped structures. Alternatively, the first semiconductor material 234 may be a continuous film and include sidewall portions (not shown) over the sidewalls of the trenches 232, wherein the sidewall portions may have a thickness less than the thickness of the upper portions 234a or the bottom portion 234b.

Figure 7:
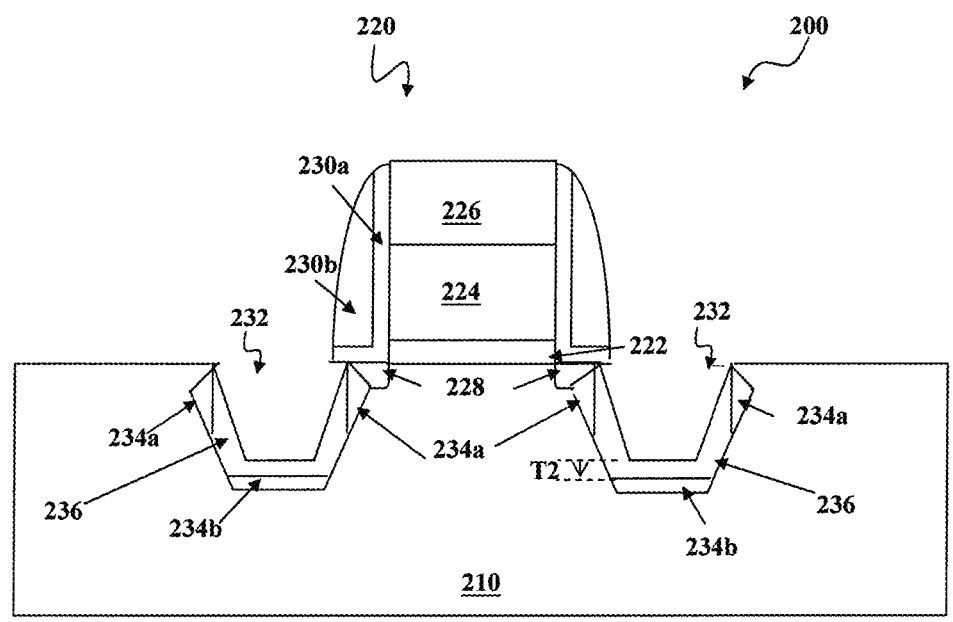

Referring to FIGS. 1 and 7, the method 100 continues with step 112 in which a second semiconductor material 236 is formed. The second semiconductor material 236, for example, is deposited by an epitaxy or epitaxial (epi) process. In one embodiment, a portion of the second semiconductor material 236 is over the first semiconductor material 234. In another embodiment, portions of the second semiconductor material 236 contact the substrate 210. In the depicted embodiment, the second semiconductor material 236 is a V-shaped feature by copying the V-shaped bottom portion of the trenches 232.

In some embodiments, the second semiconductor material 236 comprises silicon and at least one additional element. In one embodiment, the at least one additional element in the second semiconductor material 236 is the same as the additional element in the first semiconductor material 234. In one embodiment, an atomic ratio (at %) of the additional element in the second semiconductor material 236 is less than the atomic ratio (at %) of the additional element in the first semiconductor material 234. In other embodiment, the additional element in the second semiconductor material 236 is ranged within a limited amount to prevent significant defects from forming in an interface between the second semiconductor material 236 and the substrate 210. In one embodiment, the at least one additional element is Ge and the second semiconductor material 236 is SiGe for a PFET device. In another embodiment, the atomic ratio of Ge in the second semiconductor material 236 is equal to or less than about 25 at %. The second semiconductor material 236 may function as a buffer layer to prevent or reduce defects formed between the substrate 210 and the second semiconductor material 236, therefore the second semiconductor material 236 formed over the sidewalls of trench 232 may improve strain relaxation or current leakage. In some embodiments, the second semiconductor material 236 has a thickness T2 ranging between about 50 Angstroms to about 150 Angstroms.

In one embodiment, the second semiconductor material 236 is deposited by an epi process using a Si-containing gas (e.g., silane or DCS); a Ge-containing gas (e.g., $GeH_4$, $GeCl_4$); a carrier gas (e.g., $H_2$); and/or a selective etching gas (e.g., HCl). In another embodiment, the second semiconductor material 236 is deposited by an epi process with a Ge-containing gas and a Si-containing gas. In one embodiment, a mass flow ratio of the Ge-containing gas to the Si-containing gas is less than the mass flow ratio of the Ge-containing gas to the Si-containing gas for forming the first semiconductor material 234. In other embodiments, a mass flow ratio of the Ge-containing gas to the Si-containing gas for forming the second semiconductor material 236 is equal to or less than 0.025. Further, the epi process may be performed under a temperature ranging between about 500° C. and about 800° C., and under a pressure ranging between about 10 Torr and about 100 Torr.

The second semiconductor material 236 may be undoped or in-situ doped with boron and/or $BF_2$ for PFET, or doped with phosphorous and/or arsenic for NFET during formation of the second semiconductor material 236. For example, the boron dopant concentration in the second semiconductor material 236 may be ranging between about 1E18 atoms/$cm^3$ and about 1E21 atoms/$cm^3$. When the second semiconductor material 236 is undoped, it is understood that it may be doped in a subsequent process. The doping may be achieved by an ion implantation process, plasma immersion ion implantation (PIII) process, gas and/or solid source diffusion process, other suitable process, or combinations thereof. The second semiconductor material 236 may further be exposed to annealing processes, such as a rapid thermal annealing (RTA) process.

Figure 8:
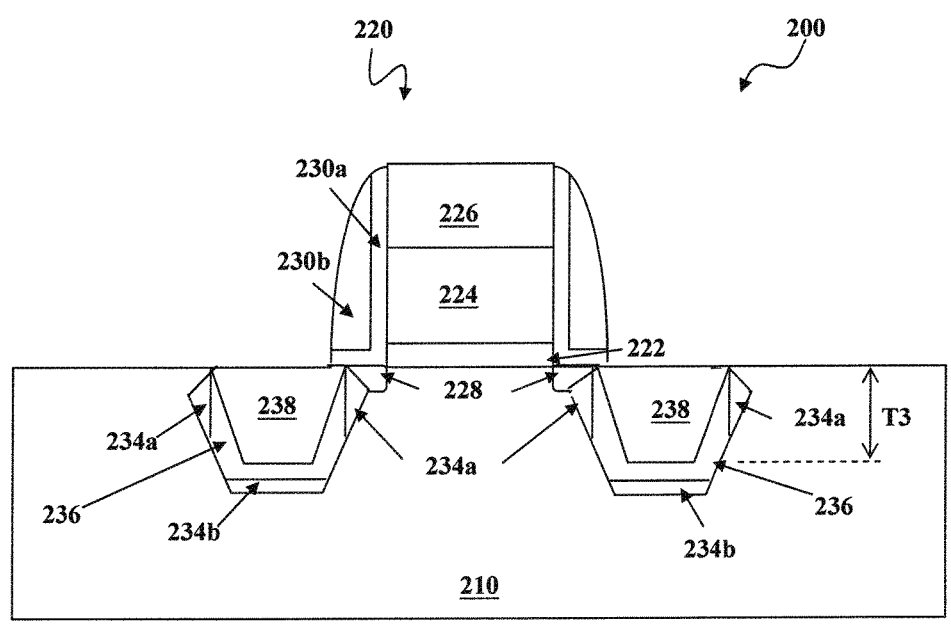

Referring to FIGS. 1 and 8, the method 100 continues with step 114 in which a third semiconductor material 238 is formed over the second semiconductor material 236. The third semiconductor material 238 may have a thickness T3 ranging between about 350 Angstroms and about 550 Angstroms to fill the trenches 232. In one embodiment, the third semiconductor material 238 has a top surface substantially co-planer with the top surface of the substrate 210. In another embodiment, the third semiconductor material 238 has a top surface higher than the top surface of the substrate 210, and the difference between the two top surfaces is less than 100 Angstroms. In the depicted embodiment, an epitaxy or epitaxial (epi) process is performed to form the third semiconductor material 238.

In some embodiments, the third semiconductor material 238 comprises silicon and at least one additional element therein. In one embodiment, the at least one additional element in the third semiconductor material 238 is the same as the additional element in the first semiconductor material 234. In one embodiment, an atomic ratio (at %) of the additional element in the third semiconductor material 238 is greater than the atomic ratio (at %) of the additional element the in the second semiconductor material 236. In one embodiment, the additional element is Ge and the third semiconductor material 238 is SiGe for a PFET device. In another embodiment, the atomic ratio of Ge in the third semiconductor material 238 is greater than about 35 at %, therefore the third semiconductor material 238 may function as a strainer to strain source/drain features to enhance carrier mobility and improve device performance.

In one embodiment, the third semiconductor material 238 is deposited by an epi process using a Si-containing gas (e.g., silane or DCS); a Ge-containing gas (e.g., $GeH_4$, $GeCl_4$); a carrier gas (e.g., $H_2$); and/or a selective etching gas (e.g., HCl). In another embodiment, the third semiconductor material 238 is deposited by an epi process using a Ge-containing gas and a Si-containing gas. In one embodiment, a mass flow ratio of the Ge-containing gas to the Si-containing gas is greater than the mass flow ratio of the Ge-containing gas to the Si-containing gas for forming the second semiconductor material 236. In other embodiments, a mass flow ratio of the Ge-containing gas to the Si-containing gas for forming the third semiconductor material 238 is equal to or greater than 0.05. Further, the epi process may be performed under a temperature ranging between about 500° C. and about 800° C., and under a pressure ranging between about 10 Torr and about 100 Torr.

The third semiconductor material 238 may be undoped or in-situ doped with boron and/or $BF_2$ for PFET, or doped with phosphorous and/or arsenic for NFET during formation of the third semiconductor material 238. For example, the boron dopant concentration in the third semiconductor material 238 may be ranging between about 1E18 atoms/$cm^3$ and about 1E21 atoms/$cm^3$. When the third semiconductor material 238 is undoped, it is understood that it may be doped in a subsequent process. The doping may be achieved by an ion implantation process, plasma immersion ion implantation (PIII) process, gas and/or solid source diffusion process, other suitable process, or combinations thereof. The third semiconductor material 238 may further be exposed to annealing processes, such as a rapid thermal annealing (RTA) process.

In some embodiments, the first, second, and third semiconductor materials 234, 236, and 238 constitute strained source/drain (S/D) features in the trenches 232. In one embodiment, the sum of thicknesses T1 and T2 of the first and second semiconductor materials 234, 236, respectively, is about ⅓ of the depth T of the trench 232. In another embodiment, the thickness T3 of the third semiconductor material 238 is about ⅔ of the depth T of the trench 232. In another embodiment, the thickness T3 of the third semiconductor material 238 is about ⅔ of the sum of depth T of the trench 232 and the difference between the top surfaces of the third semiconductor material 238 and the substrate 210 if the top surface of the third semiconductor material 238 being higher than the top surface of the substrate 210.

Figure 9:
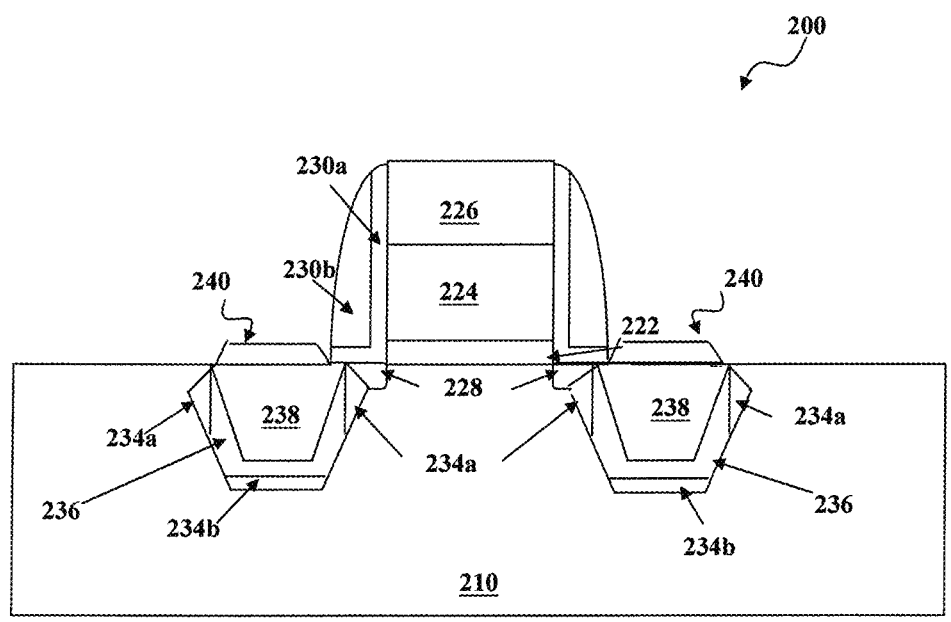

Referring to FIGS. 1 and 9, the method 100 continues with step 116 in which a fourth semiconductor material 240 is formed over the third semiconductor material 238 and contacts the top surface of third semiconductor material 238. In the depicted embodiment, an epitaxy or epitaxial (epi) process is performed to form the fourth semiconductor material 240.

In one embodiment, the fourth semiconductor material 240 comprises silicon and at least one additional element therein. In another embodiment, an atomic ratio (at %) of the additional element in the fourth semiconductor material 240 is less than the atomic ratio (at %) of the additional element in the third semiconductor material 238. The fourth semiconductor material 240 may function as a contact feature to decrease the contact resistance between the third semiconductor material 238 and a silicide layer formed subsequently. In one embodiment, the fourth semiconductor material 240 has a thickness ranging between about 80 Angstroms to about 200 Angstroms. In some embodiments, the fourth semiconductor material 240 may be deposited by an epi process using the same chemicals as mentioned above.

In one embodiment, the additional element is Ge and the fourth semiconductor material 240 is SiGe for a PFET device. In another embodiment, the atomic ratio of Ge in the fourth semiconductor material 240 is less than about 20 at %. In some embodiments, a mass flow ratio of the Ge-containing gas to the Si-containing for forming the fourth semiconductor material 240 may be equal to or less than 0.01. Further, the epi process may be performed under a temperature ranging between about 500° C. and about 800° C., and under a pressure ranging between about 10 Torr and about 100 Torr. The fourth semiconductor material 240 may be undoped or in-situ doped with dopants the same as to the third semiconductor material 240. The fourth semiconductor material 240 may have a dopant concentration ranging between about 1E18 atoms/cm³ and about 1E21 atoms/cm³. The fourth semiconductor material 240 may further be exposed to annealing processes, such as a rapid thermal annealing (RTA) process.

The semiconductor 200 continues with processing to complete fabrication as discussed briefly below. For example, silicide features are formed on the raised source/drain features to reduce the contact resistance. The silicide features may be formed on the source and drain regions by a process including depositing a metal layer, annealing the metal layer such that the metal layer is able to react with silicon to form silicide, and then removing the non-reacted metal layer.

An inter-level dielectric (ILD) layer is formed on the substrate and a chemical mechanical polishing (CMP) process is further applied to the substrate to planarize the substrate. Further, a contact etch stop layer (CESL) may be formed on top of the gate structure before forming the ILD layer. In an embodiment, the gate electrode remains poly in the final device. In another embodiment, the poly is removed and replaced with a metal in a gate last or gate replacement process. In a gate last process, the CMP process on the ILD layer is continued to expose the poly of the gate structures, and an etching process is performed to remove the poly, thereby forming trenches. The trenches are filled with a proper work function metal (e.g., p-type work function metal and n-type work function metal) for the PFET devices and the NFET devices.

A multilayer interconnection (MLI) including metal layers and inter-metal dielectric (IMD) is formed over the substrate to electrically connect various features or structures of the semiconductor device. The multilayer interconnection includes vertical interconnects, such as conventional vias or contacts, and horizontal interconnects, such as metal lines. The various interconnection features may implement various conductive materials including copper, tungsten and silicide. In one example, a damascene process is used to form copper multilayer interconnection structure.

In summary, the disclosed method provides a processing for forming an improved source/drain features in the semiconductor device. Semiconductor device with the improved source/drain features may prevent or reduce defects and achieve high strain effect resulted from epi layer, therefore to enhance the device performance. It has been observed that the disclosed methods and integrated circuit devices result in improved device performance including, but not limited to, improved control over short channel effects, increased saturation current, improved control of metallurgical gate length, increased carrier mobility, and decreased contact resistance between the source/drain and silicide features. It is understood that different embodiments may have different advantages, and that no particular advantage is necessarily required of any embodiment.

An aspect of this description relates to a method. The method includes etching a trench in a substrate adjacent to a gate structure, wherein the trench includes a bottom surface and a tip portion extending under a spacer of the gate structure. The method further includes epitaxially growing a first semiconductor material in the trench, wherein the first semiconductor material covers an entirety of the bottom surface of the trench, and the first semiconductor material grows in the tip portion. The method further includes epitaxially growing a second semiconductor material in the trench, wherein the second semiconductor material is different from the first semiconductor material, the second semiconductor material covers the first semiconductor material, and the second semiconductor material directly contacts the substrate between the bottom surface of the trench and the tip portion. In some embodiments, the etching of the trench includes forming a faceted trench, the substrate at the bottom of the trench is a {100} facet, and the tip portion is defined by two {111} facets. In some embodiments, the method further includes doping the substrate to define a lightly doped source/drain (LDD) region. In some embodiments, the doping of the substrate is performed prior to the etching of the trench. In some embodiments, the method further includes epitaxially growing a third semiconductor material in the trench, wherein the third semiconductor material is different from the second semiconductor material, and the second semiconductor material surrounds the third semiconductor material. In some embodiments, the epitaxial growing of the second semiconductor material includes epitaxially growing the second semiconductor material entirely below a top-most surface of the substrate. In some embodiments, the epitaxial growing of the second semiconductor material includes in-situ doping the second semiconductor material.

An aspect of this description relates to a method. The method includes etching a trench in a substrate. Etching the trench defines a first facet having a {111} crystallographic plane; a second facet having a {111} crystallographic plane; and a third facet having a {100} crystallographic plane, wherein the second facet is between the first facet and the third facet. The method further includes epitaxially growing a first semiconductor material in the trench, wherein the first semiconductor material covers the third facet, and the first semiconductor material grows at an intersection of the first facet and the second facet. The method further includes epitaxially growing a second semiconductor material in the trench, wherein the second semiconductor material is different from the first semiconductor material, the second semiconductor material covers the first semiconductor material, and the second semiconductor material directly contacts the second facet. In some embodiments, the method further includes forming a gate structure over the substrate. In some embodiments, etching the trench includes etching the trench adjacent to the gate structure. In some embodiments, etching the trench includes defining the intersection of the first facet and the second facet under the gate structure. In some embodiments, the method further includes epitaxially growing a third semiconductor material over the second semiconductor material. In some embodiments, epitaxially growing the third semiconductor material includes epitaxially growing the third semiconductor material to a thickness ranging from 350 angstroms to 550 angstroms. In some embodiments, epitaxially growing the third semiconductor material includes epitaxially growing the third semiconductor material to extend above a top surface of the substrate. In some embodiments, the method further includes forming a contact structure over the third semiconductor material.

An aspect of this description relates to a method. The method includes etching a trench in a substrate. Etching the trench defines a first facet having a {111} crystallographic plane; a second facet having a {111} crystallographic plane; and a third facet having a {100} crystallographic plane, wherein the third facet is between the first facet and the second facet. The method further includes epitaxially growing a first semiconductor material in the trench, wherein the first semiconductor material covers the third facet, and the first semiconductor material grows at an upper portion of each of the first facet and the second facet. The method further includes epitaxially growing a second semiconductor material in the trench, wherein the second semiconductor material is different from the first semiconductor material, the second semiconductor material covers the first semiconductor material, and the second semiconductor material directly contacts the second facet. In some embodiments, epitaxially growing the second semiconductor material includes epitaxially growing the second semiconductor material in direct contact with the first facet. In some embodiments, epitaxially growing the second semiconductor material includes epitaxially growing the second semiconductor material to a first thickness over the first semiconductor material over the third facet, and the first thickness ranges from 50 angstroms to 150 angstroms. In some embodiments, epitaxially growing the first semiconductor material includes epitaxially growing the first semiconductor material having a first maximum width on the second fact, wherein the first maximum width is measured in a direction parallel to a top surface of the substrate, and the first maximum width ranges from 50 angstroms to 150 angstroms. In some embodiments, epitaxially growing the second semiconductor material includes epitaxially growing the second semiconductor material entirely below a top surface of the substrate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   etching a trench in a substrate adjacent to a gate structure, wherein the trench comprises a bottom surface and a tip portion extending under a spacer of the gate structure;
   epitaxially growing a first semiconductor material in the trench, wherein the first semiconductor material covers an entirety of the bottom surface of the trench, and the first semiconductor material grows in the tip portion; and
   epitaxially growing a second semiconductor material in the trench, wherein the second semiconductor material is different from the first semiconductor material, the second semiconductor material covers the first semiconductor material, and the second semiconductor material directly contacts the substrate between the bottom surface of the trench and the tip portion.

2. The method of claim 1, wherein the etching of the trench comprises forming a faceted trench, the substrate at the bottom of the trench is a {100} facet, and the tip portion is defined by two {111} facets.

3. The method of claim 1, further comprising doping the substrate to define a lightly doped source/drain (LDD) region.

4. The method of claim 3, wherein the doping of the substrate is performed prior to the etching of the trench.

5. The method of claim 1, further comprising epitaxially growing a third semiconductor material in the trench, wherein the third semiconductor material is different from the second semiconductor material, and the second semiconductor material surrounds the third semiconductor material.

6. The method of claim 1, wherein the epitaxial growing of the second semiconductor material comprises epitaxially growing the second semiconductor material entirely below a top-most surface of the substrate.

7. The method of claim 1, wherein the epitaxial growing of the second semiconductor material comprises in-situ doping the second semiconductor material.

8. A method comprising:
   etching a trench in a substrate, wherein etching the trench defines:
   a first facet having a {111} crystallographic plane;
   a second facet having a {111} crystallographic plane; and
   a third facet having a {100} crystallographic plane, wherein the second facet is between the first facet and the third facet;
   epitaxially growing a first semiconductor material in the trench, wherein the first semiconductor material covers the third facet, and the first semiconductor material grows at an intersection of the first facet and the second facet; and
   epitaxially growing a second semiconductor material in the trench, wherein the second semiconductor material is different from the first semiconductor material, the second semiconductor material covers the first semiconductor material, and the second semiconductor material directly contacts the second facet.

9. The method of claim 8, further comprising forming a gate structure over the substrate.

10. The method of claim 9, wherein etching the trench comprises etching the trench adjacent to the gate structure.

11. The method of claim 9, wherein etching the trench comprises defining the intersection of the first facet and the second facet under the gate structure.

12. The method of claim 8, further comprising epitaxially growing a third semiconductor material over the second semiconductor material.

13. The method of claim 12, wherein epitaxially growing the third semiconductor material comprises epitaxially growing the third semiconductor material to a thickness ranging from 350 angstroms to 550 angstroms.

14. The method of claim 12, wherein epitaxially growing the third semiconductor material comprises epitaxially growing the third semiconductor material to extend above a top surface of the substrate.

15. The method of claim 12, further comprising forming a contact structure over the third semiconductor material.

16. A method comprising:
   etching a trench in a substrate, wherein etching the trench defines:
      a first facet having a {111} crystallographic plane;
      a second facet having a {111} crystallographic plane; and
      a third facet having a {100} crystallographic plane, wherein the third facet is between the first facet and the second facet;
   epitaxially growing a first semiconductor material in the trench, wherein the first semiconductor material covers the third facet, and the first semiconductor material grows at an upper portion of each of the first facet and the second facet; and
   epitaxially growing a second semiconductor material in the trench, wherein the second semiconductor material is different from the first semiconductor material, the second semiconductor material covers the first semiconductor material, and the second semiconductor material directly contacts the second facet.

17. The method of claim 16, wherein epitaxially growing the second semiconductor material comprises epitaxially growing the second semiconductor material in direct contact with the first facet.

18. The method of claim 16, wherein epitaxially growing the second semiconductor material comprises epitaxially growing the second semiconductor material to a first thickness over the first semiconductor material over the third facet, and the first thickness ranges from 50 angstroms to 150 angstroms.

19. The method of claim 16, wherein epitaxially growing the first semiconductor material comprises epitaxially growing the first semiconductor material having a first maximum width on the second fact, wherein the first maximum width is measured in a direction parallel to a top surface of the substrate, and the first maximum width ranges from 50 angstroms to 150 angstroms.

20. The method of claim 16, wherein epitaxially growing the second semiconductor material comprises epitaxially growing the second semiconductor material entirely below a top surface of the substrate.

\* \* \* \* \*